United States Patent [19]
Mori et al.

[11] Patent Number: 6,078,046
[45] Date of Patent: Jun. 20, 2000

[54] APPARATUS FOR MEASURING ELECTRON BEAM INTENSITY AND ELECTRON MICROSCOPE COMPRISING THE SAME

[75] Inventors: Hirotaro Mori, Suita; Kiyokazu Yoshida, Toyonaka, both of Japan

[73] Assignee: Osaka University, Suita, Japan

[21] Appl. No.: 09/081,778

[22] Filed: May 20, 1998

[30] Foreign Application Priority Data

Nov. 17, 1997 [JP] Japan ................................... 9-318542

[51] Int. Cl.$^7$ ...................................................... G01K 1/08
[52] U.S. Cl. ........................................... 250/311; 250/397
[58] Field of Search .................................... 250/311, 397

[56] References Cited

U.S. PATENT DOCUMENTS 5,517,033  5/1996  Krivanek et al. ....................... 250/311
5,811,805  9/1998  Osakabe et al. ......................... 250/311

*Primary Examiner*—Kiet Nguyen
*Attorney, Agent, or Firm*—Venable

[57] ABSTRACT

In an apparatus for measuring an intensity of an electron beam, the electron beam is made incident a fluorescent screen and a part of the incident electron beam is converted into an optical image, and the optical image formed on the fluorescent screen is picked-up by a television camera by a reflection mirror having a central hole and being inclined with respect to a direction into which the optical image is made incident upon the reflection mirror. A part of the electron beam transmitted through the fluorescent screen and passing through the central hole of the reflection mirror is made incident upon a Faraday case, which generates an electric current representing an intensity of the electron beam impinging upon the fluorescent screen. In the transmission type electron microscope, after measuring an intensity of the electron beam impinging upon the fluorescent screen, after removing the fluorescent screen, reflection mirror and Faraday cage from an optical axis, a shutter is opened to expose a photographic film to the electron beam for a time period which provides an optimum exposure on the basis of the measured intensity of the electron beam.

13 Claims, 3 Drawing Sheets

FIG_2
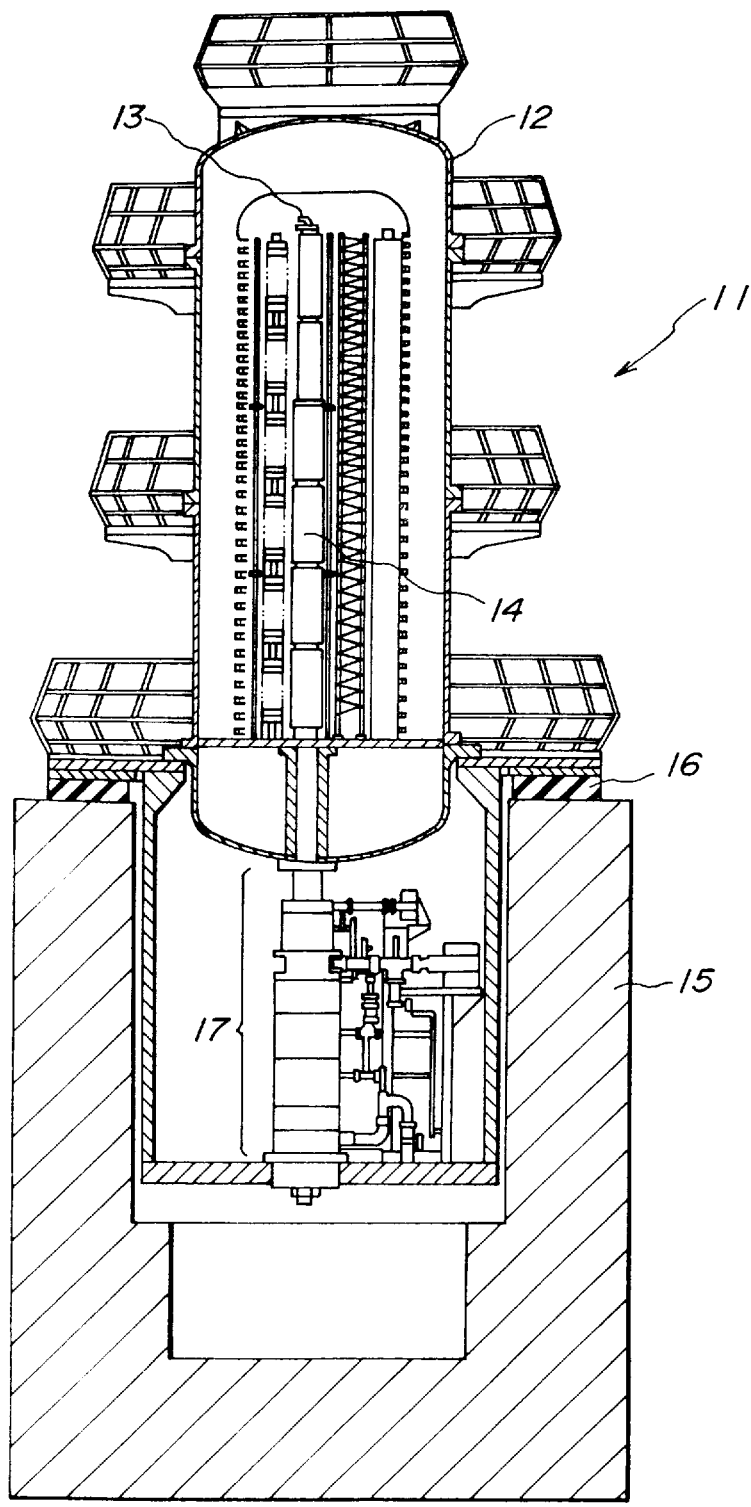

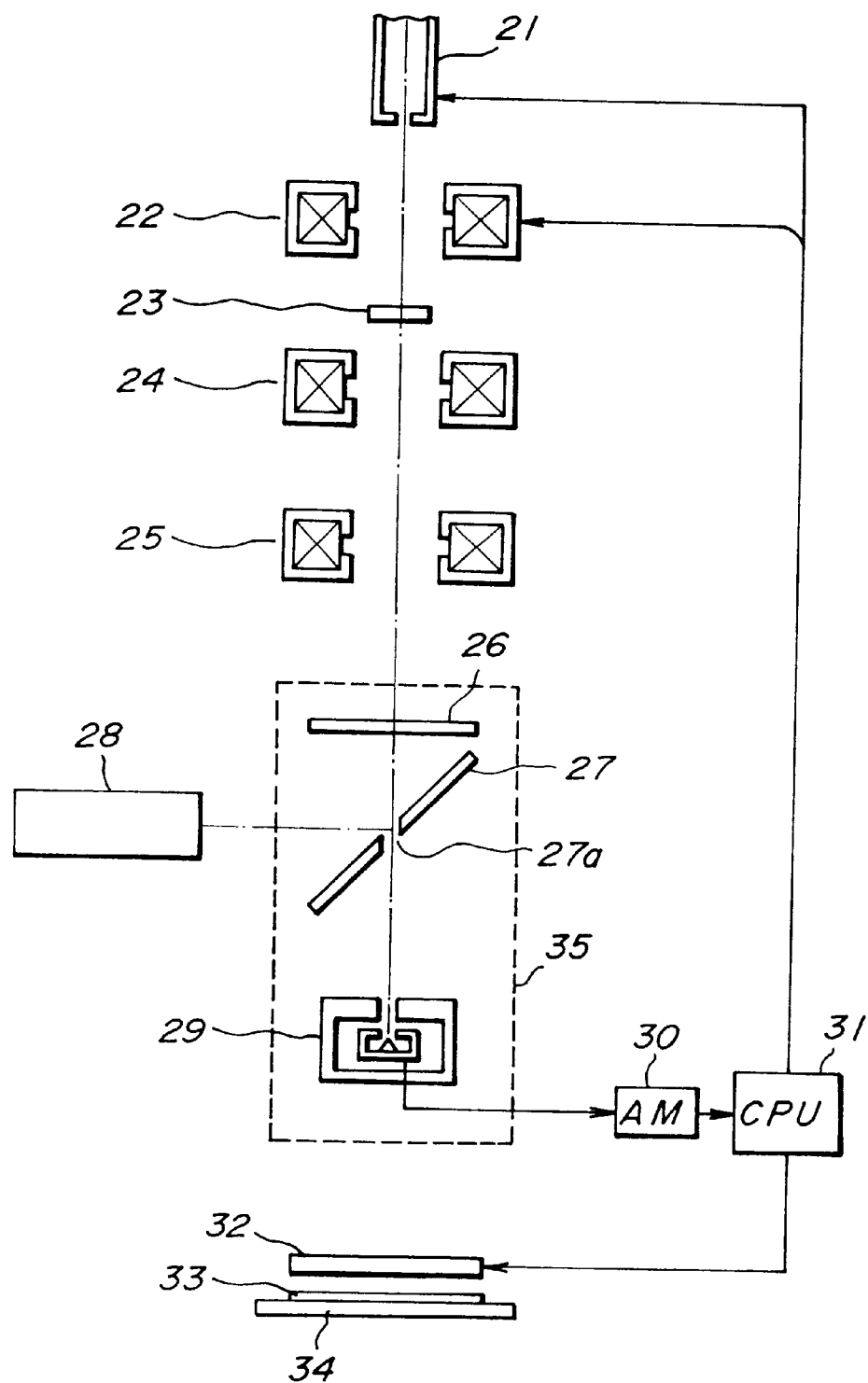
FIG_3

APPARATUS FOR MEASURING ELECTRON BEAM INTENSITY AND ELECTRON MICROSCOPE COMPRISING THE SAME

BACKGROUND OF THE INVENTION

1. Field of the Invention

The present invention generally relates to a technique for measuring an intensity of an electron beam, and more particularly relates to an apparatus for measuring an intensity of an electron beam and to an electron microscope including the apparatus for measuring an intensity of an electron beam.

2. Related Art Statement

There has been proposed a transmission type electron microscope comprising an electron gun producing an electron beam, a condenser lens system for converging the electron beam and projecting the thus converged electron beam onto a specimen, an objective lens system for forming an electron beam image of the specimen, an enlarging lens system for forming an enlarged electron beam image of the specimen and projecting the enlarged electron beam image, a fluorescent screen converting the enlarged electron beam image of the specimen into an optical image of the specimen, and a shutter arranged between the enlarging lens system and a photographic film.

In such a transmission type electron microscope, contract and brightness vary over a very wide range, and therefore it is necessary to provide a certain index for projecting an optimum electron beam image of the specimen onto an image record medium, for example, a photographic film. In a remote observing system in which an optical image of a specimen is observed with a television camera, it is particularly difficult to judge an optimum exposure accurately based on a brightness of the fluorescent screen through experiences, because the brightness of the optical image changes in accordance with a sensitivity of the television camera. It is important for the transmission type electron microscope to provide a precise control for the exposure by means of which an operator can have a confidence that excellent photographs can be obtained. It has been proposed to arrange temporally a detector in front of the optical image monitoring fluorescent screen only when an intensity of the electron beam is to be measured. It has been further proposed to measure an intensity of an electron beam flowing into the fluorescent screen by means of a plate electrode built-in the screen.

In the former method, an optical image of a specimen could not be monitored by the television camera during the electron beam intensity measurement, because the detector is arranged in front of the fluorescent screen. That is to say, both the observation of the optical image and the measurement of the electron beam intensity could not be performed simultaneously. The latter method has been generally used in conventional electron microscopes having low electron beam energy, but could not be applied to ultra-high voltage electron microscopes using an electron beam having high energy owing to a reason that a detected current is no more proportional to an intensity of the electron beam. This is due to a fact that a difference between electrons trapped by the fluorescent screen and secondary electrons emitted from the florescent screen is detected. Therefore, in an extreme case, a polarity of the detected current might be reversed, and the detected signal could not be used any more.

In order to perform the measurement of the intensity of the electron beam effectively for a diffraction image and an electron beam image having a high contrast, it is preferable to apply the center preponderant measurement system, almost equal to the spot measurement.

SUMMARY OF THE INVENTION

It is an object of the present invention to eliminate these disadvantages of the conventional methods, and provide a novel and useful apparatus for measuring an intensity of an electron beam, while at the same time an observation of an optical image can be performed without any operations.

It is another object of the invention to provide a novel and useful electron microscope including the apparatus for measuring precisely an intensity of an electron beam intensity and being capable of exposing an image record medium optimally.

According to the invention, an apparatus for measuring an intensity of an electron beam comprises:

a fluorescent screen for receiving an electron beam whose intensity is to be measured and converting a part of the received electron beam into an optical image;

a reflection mirror for reflecting the optical image produced by the fluorescent screen into a direction which is inclined with respect to a direction into which the optical image is made incident upon the reflection mirror;

an image observing means for observing the optical image reflected by said reflection mirror; and an electron detecting means for receiving an electron beam transmitted through said fluorescent screen and reflection mirror and converting the received electron beam into an electric signal which is a measure for an intensity of the electron beam impinging upon the fluorescent screen.

According to the invention, a transmission type electron microscope comprises:

an electron gun generating an electron beam;

a condenser lens system for converging the electron beam generated by the electron gun and projecting the converged electron beam onto a specimen;

an objective lens system for receiving the electron beam transmitted through the specimen and forming an electron beam image of the specimen;

an enlarging lens system for enlarging the electron beam image formed by said objective lens system;

a fluorescent screen for receiving the electron beam image projected by said enlarging lens system and converting the received electron beam image into an optical image;

a reflection mirror for reflecting the optical image generated by said fluorescent screen into a direction which is inclined with respect to a direction into which said optical image is made incident upon the reflection mirror;

an image observing means for receiving the optical image reflected by said reflection mirror and producing an image of the specimen which can be observed by an operator;

an electron detecting means for receiving an electron beam transmitted through said fluorescent screen and reflection mirror and converting the received electron beam into an electric signal which is a measure for an intensity of the electron beam transmitted through the specimen and impinging upon the fluorescent screen;

an image record medium arranged to receive and record the enlarged electron beam image projected by said enlarging lens system; and a shutter arranged removably between said enlarging lens system and said photographic film to expose selectively the image record medium to the enlarged electron beam image;

whereby said fluorescent screen, reflection mirror and electron detecting means are arranged removably between said enlarging lens system and said shutter, and an exposure of the enlarged electron image to the image record medium is controlled on the basis of said electric signal generated from the electron detecting means.

In a preferable embodiment of the electron beam intensity measuring apparatus and the electron microscope according to the invention, said reflection mirror is formed by a flat mirror having a center hole and said electron detecting means is formed by a Faraday cage.

Further, according to the invention, said image observing means preferably comprises a television camera for picking-up the optical image of the specimen reflected by said reflection mirror to derive an image signal and a monitor for receiving the image signal to display an image of the specimen.

BRIEF DESCRIPTION OF THE DRAWINGS

FIG. 2 is a schematic view illustrating an embodiment of the transmission type electron microscope according to the invention; and FIG. 3 is a schematic view depicting a major part of the microscope shown in FIG. 2.

DESCRIPTION OF THE PREFERRED EMBODIMENT

Figure 1:
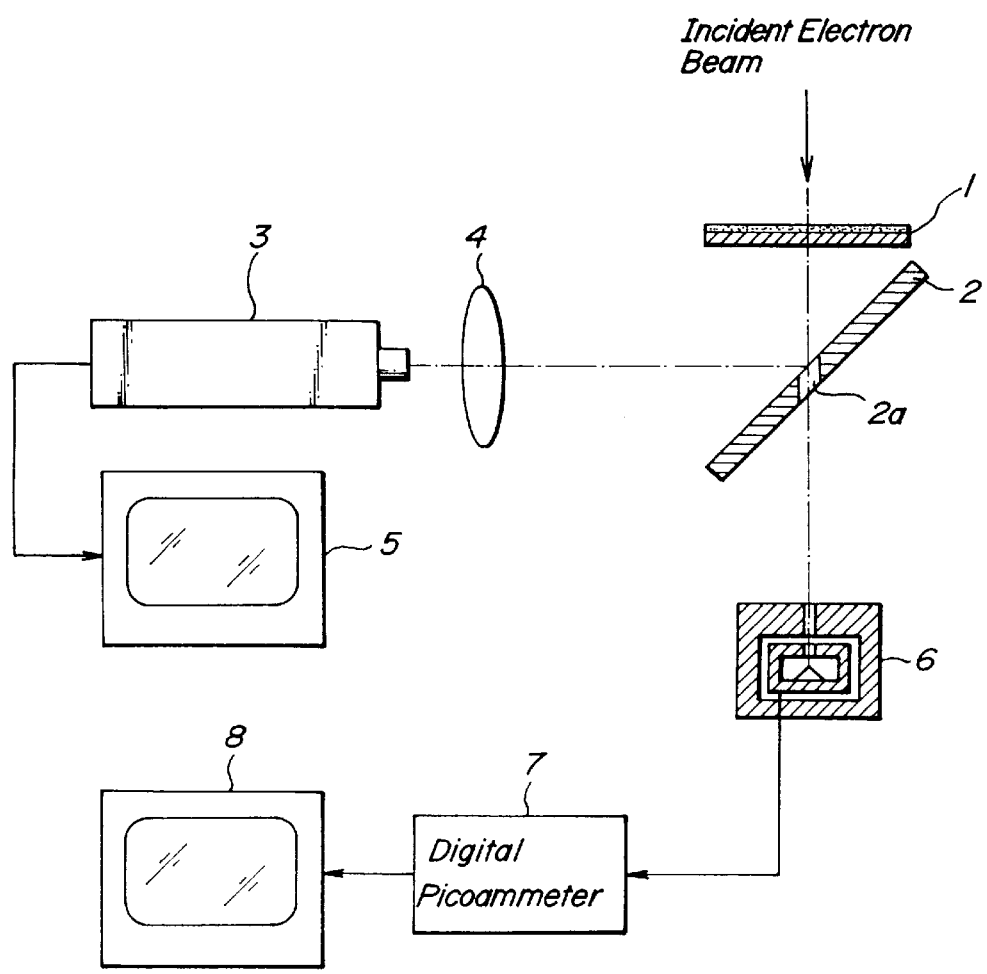
FIG. 1 is a schematic view showing an embodiment of the apparatus for measuring an intensity of an electron beam according to the present invention.

FIG. 1 is a schematic view showing an embodiment of the apparatus for measuring an intensity of an electron beam according to the invention. It should be noted that this drawing is represented simply for the sake of explanation, and therefore shapes and dimensions thereof are different from those of an actual device.

An electron beam whose intensity is to be measured is made incident upon a fluorescent screen 1, and a part of the incident electron beam is converted into an optical image. The optical image thus formed on the fluorescent screen 2 is picked-up by a television camera 3 by means a reflection mirror 2 having a central hole 2a and an optical lens 4. The reflection mirror 2 is arranged to be inclined with respect to a direction in which the optical image is made incident upon the reflection mirror 2. In the present embodiment, the reflection mirror 2 is inclined by 45 degrees with respect to the incident optical axis. In this manner, the optical image formed on the fluorescent screen 2 by the incident electron beam can be displayed on an image monitor 5. Since the reflection mirror 2 is arranged far from the focal plane of the optical lens 4, the central hole 2a does not affect a quality of the image displayed on the image monitor 5.

A part of the incident electron beam transmitted through the fluorescent screen 1 and the center hole 2a of the reflection mirror 2 is made incident upon an electron detecting device 6. In the present embodiment, the electron detecting device 6 is formed by a Faraday cage. Then, the Faraday cage 6 generates an electric current whose amplitude represents an intensity of the electron beam impinging upon the Faraday cage. The amplitude of this electric current is detected by a digital picoammeter 7 and an output of this digital picoammeter 7 is supplied to a control unit 8 including a display device. As stated above, the amplitude of the current signal supplied by the Faraday cage 6 represents an intensity of the electron beam impinging upon Faraday cage, an intensity of the electron beam being incident upon the fluorescent screen can be measured by suitably processing the signal supplied from the digital picoammeter 7.

FIG. 2 is a schematic view showing an embodiment of the electron microscope according to the invention and FIG. 3 is a schematic view illustrating a major portion of the electron microscope.

As shown in FIG. 2, the electron microscope 11 comprises a high voltage tank 12, in which an electron gun 13 and accelerating tubes 14. The high voltage tank 12 is supported by a frame member 15 by means of a damper 16. Below the high voltage tank 12, is arranged a major section 17 including condenser lens system, specimen chamber, objective lens system, enlarging lens system, fluorescent screen, reflection mirror, shutter, film support and so on.

FIG. 3 is a schematic view the major section 17 of the electron microscope shown in FIG. 2. In FIG. 3, the assembly in the high voltage tank 12 is represented by an electron gun 21. An electron beam emitted by the electron gun 21 is focused by a focus lens 22 and is made incident upon a specimen 23. The electron beam transmitted through the specimen 23 is collected by an objective lens 24 to form an electron beam image. The electron beam image thus formed is enlarged by an enlarging lens 25 and the enlarged electron image is made incident upon a fluorescent screen 26. A part of the electron beam impinging upon the fluorescent screen 26 is converted into light and optical image is formed on the fluorescent screen 26, and most of the electron beam is transmitted through the fluorescent screen 26.

The optical image formed on the fluorescent screen 26 is picked-up by a television camera 28 by means of a reflection mirror 27 having a central hole 27a. The reflection mirror 27 is inclined with respect to a direction into which the optical image is made incident upon the reflection mirror. In this manner, the optical image formed on the fluorescent screen 26 can be monitored.

A part of the electron beam transmitted through the fluorescent screen 26 passes through the central hole 27a of the reflection mirror 27 and is made incident upon a Faraday cage 29. As explained above, the Faraday cage 29 produces an electric current signal which represents an intensity of the electron beam impinging upon the Faraday cage through the fluorescent screen 26 and the central hole 27a of the reflection mirror 27. The thus generated current signal is measured by a digital picoammeter (AM) 30 and an output signal of the digital picoammeter is supplied to a control computer (CPU) 31. Then, the control computer 31 generates a control signal which represents an intensity of the electron beam impinging upon the fluorescent screen 26.

Below the fluorescent screen 26, there is arranged a shutter 32 which can prevent the electron beam from being transmitted therethrough and being made incident upon an image record medium, e.g. a photographic film 33 supported by a film holder 34.

According to the invention, the fluorescent screen 26, reflection mirror 27 and Faraday cage 29 are arranged on a housing schematically shown by a reference numeral 35. The housing 35 is arranged to be movable with respect to an optical axis extending from the fluorescent screen 26 and the photographic film 33. That is to say, the housing 35 can assume a first position in which the fluorescent screen 26, reflection mirror 27 and Faraday cage 29 are inserted into the optical axis, and a second position in which all the above elements 26, 27 and 29 are removed from the optical axis and thus the electron beam may be directly made incident upon the photographic film 33.

In the present embodiment, the fluorescent screen 26 is formed by applying P22 fluorescent material powder on a sapphire substrate having a thickness of 0.4 mm. A diameter of the central hole 27a of the reflection mirror 27 is 1 mm. An accelerating voltage is set to 3000 KV.

In case of taking photographs of the electron beam image on the photographic film, it is necessary to adjust and control an exposure amount for the photographic film in a precise manner. To this end, according to the invention, the housing 35 is set into the first position and an intensity of the electron beam impinging upon the fluorescent screen 26 is measured. During this measurement, the operator can always monitor the optical image formed on the fluorescent screen 26.

Next, upon taking a photograph, the housing 35 is removed into the second position such that the electron beam emanating from the enlarging lens system 25 can be made incident upon the photographic film 33 for a time interval during which the shutter 32 is driven to remove from the optical axis under a control of the control computer 31. As stated above, since an intensity of the electron beam has been measured, the control computer 31 can control the shutter 32 in such a manner that an optimal exposure can be effected. It should be noted that an exposure for the photographic film 33 may be controlled by adjusting an intensity of the electron beam emitted by the electron gun 21. Furthermore, an exposure for the photographic film 33 may be adjusted also by controlling a magnetic excitation of the condenser lens system 22.

The present invention is not to the above embodiments and many alternations and modifications may conceived by those skilled in the art within the scope of the invention. For example, the electron beam intensity measuring apparatus according to the invention may be used in other devices than the electron microscope such as an electron beam lithography apparatus, in which both the observation of the optical image and the measurement of an intensity of an electron beam have to be conducted simultaneously.

In the above embodiments, the hole is formed at a center of the reflection mirror, but a thickness of a center portion of the reflection mirror may be deceased such that an electron beam can practically pass the thin portion of the reflection mirror.

Moreover in the above embodiments, the Faraday cage is used as the electron detecting device, but any other electron detecting device may be also used.

In the embodiments explained above, the reflection mirror is arranged to reflect the optical image into a direction which is inclined by 90 degrees with respect to the incident direction, but the reflection mirror may be arranged to reflect the optical image into a direction which is inclined with respect to the incident direction by an angle other than 90 degrees. Furthermore, an observing window may be formed in a housing of the electron microscope so that the optical image can be observed by naked eyes.

In the apparatus for measuring an intensity of an electron beam according to the present invention, both the observation of the optical image and the measurement of the electron beam intensity can be performed simultaneously without requiring any operation of a user. Moreover, in the transmission type electron microscope according to the invention, the optimum exposure can be accurately obtained upon the electron beam image recording the image record medium. When the Faraday cage is arranged such that an electron beam positioned at a center of a field of view is made detected, the center preponderant measurement almost equal to the spot measurement can be performed.

What is claimed is:

1. An apparatus for measuring an intensity of an electron beam comprising:
   a fluorescent screen for receiving an electron beam whose intensity is to be measured and converting a part of the received electron beam into an optical image;
   a reflection mirror for reflecting the optical image produced by the fluorescent screen into a direction which is inclined with respect to a direction into which the optical image is made incident upon the reflection mirror;
   an image observing means for observing the optical image reflected by said reflection mirror; and
   an electron detecting means for receiving an electron beam transmitted through said fluorescent screen and reflection mirror and converting the received electron beam into an electric signal which is a measure for an intensity of the electron beam impinging upon the fluorescent screen.

2. An apparatus according to claim 1, wherein said reflection mirror has a hole at a center thereof, and an electron beam passing through the hole is detected by the electron detecting means.

3. An apparatus according to claim 1, wherein said electron detecting means includes a Faraday cage generating an electric current which represents an intensity of the incident electron beam.

4. An apparatus according to claim 3, wherein said electron detecting means further includes a digital picoammeter which receives the electric current generated by said Faraday cage.

5. An apparatus according to claim 2, wherein said electron detecting means includes a Faraday cage generating an electric current which represents an intensity of the incident electron beam.

6. A transmission type electron microscope comprising:
   an electron gun generating an electron beam;
   a condenser lens system for converging the electron beam generated by the electron gun and projecting the converged electron beam onto a specimen;
   an objective lens system for receiving the electron beam transmitted through the specimen and forming an electron beam image of the specimen;
   an enlarging lens system for enlarging the electron beam image formed by said objective lens system;
   a fluorescent screen for receiving the electron beam image projected by said enlarging lens system and converting the received electron beam image into an optical image;
   a reflection mirror for reflecting the optical image generated by said fluorescent screen into a direction which is inclined with respect to a direction into which said optical image is made incident upon the reflection mirror;
   an image observing means for receiving the optical image reflected by said reflection mirror and producing an image of the specimen which can be observed by an operator;
   an electron detecting means for receiving an electron beam transmitted through said fluorescent screen and reflection mirror and converting the received electron beam into an electric signal which is a measure for an intensity of the electron beam transmitted through the specimen and impinging upon the fluorescent screen;

an image record medium arranged to receive and record the enlarged electron beam image projected by said enlarging lens system; and a shutter arranged removably between said enlarging lens system and said image record medium to expose selectively the image record medium to the enlarged electron beam image;

whereby said fluorescent screen, reflection mirror and electron detecting means are arranged removably between said enlarging lens system and said shutter, and an exposure of the enlarged electron image to the image record medium is controlled on the basis of said electric signal generated from the electron detecting means.

7. An electron microscope according to claim 6, wherein said reflection mirror has a hole at a center thereof, and an electron beam passing through the hole is detected by the electron detecting means.

8. An electron microscope according to claim 6 or 7, wherein said electron detecting means includes a Faraday cage generating an electric current which represents an intensity of the incident electron beam.

9. An apparatus according to claim 8, wherein said electron detecting means further includes a digital picoammeter which receives the electric current generated by said Faraday cage.

10. An electron microscope according to claim 6, wherein said image observing means comprises a television camera for picking-up the optical image of the specimen formed on the fluorescent screen by means of said reflection mirror to derive an image signal, and a monitor for receiving the image signal to display an image of the specimen.

11. An electron microscope according to claim 7, wherein said electron detecting means includes a Faraday cage generating an electric current which represents an intensity of the incident electron beam.

12. An apparatus according to claim 5, wherein said electron detecting means further includes a digital picoammeter which receives the electric current generated by said Faraday cage.

13. An apparatus according to claim 11, wherein said electron detecting means further includes a digital picoammeter which receives the electric current generated by said Faraday cage.

* * * * *

UNITED STATES PATENT AND TRADEMARK OFFICE
CERTIFICATE OF CORRECTION

PATENT NO : 6,078,046
DATED : June 20, 2000
INVENTOR(S) : Mori et al.

It is certified that error appears in the above-identified patent and that said Letters Patent are hereby corrected as shown below:

On the title page, line 30, change the priority information to read as --November 19, 1997 [JP] Japan ................9-318542--

Signed and Sealed this

Twenty-second Day of May, 2001

Attest:

NICHOLAS P. GODICI

*Attesting Officer*   *Acting Director of the United States Patent and Trademark Office*